United States Patent
Kuse et al.

(10) Patent No.: US 7,511,321 B2
(45) Date of Patent: Mar. 31, 2009

(54) METHOD FOR FORMING A DIELECTRIC LAYER AND RELATED DEVICES

(75) Inventors: Ronald John Kuse, Tsukuba (JP); Tetsuji Yasuda, Tsukuba (JP)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/475,680

(22) Filed: Jun. 26, 2006

(65) Prior Publication Data
US 2007/0007604 A1    Jan. 11, 2007

Related U.S. Application Data

(62) Division of application No. 10/435,239, filed on May 8, 2003, now Pat. No. 7,101,811.

(51) Int. Cl.
*H01L 29/76* (2006.01)
(52) U.S. Cl. .............. 257/288; 257/410; 257/411; 257/E29.255
(58) Field of Classification Search ............... 257/288, 257/410, 411, E29.255; 438/775, 785
See application file for complete search history.

(56) References Cited

U.S. PATENT DOCUMENTS

| | | | |
|---|---|---|---|
| 5,602,403 A | 2/1997 | Aklufi | |
| 5,866,474 A | 2/1999 | Liu | |
| 6,287,917 B1 | 9/2001 | Park et al. | |
| 6,548,366 B2 | 4/2003 | Niimi et al. | |
| 6,576,967 B1 | 6/2003 | Schaeffer, III et al. | |
| 6,613,677 B1 | 9/2003 | Herbots et al. | |
| 6,620,702 B2 | 9/2003 | Shih et al. | |
| 6,642,573 B1 | 11/2003 | Halliyal et al. | |
| 6,649,537 B1 | 11/2003 | Reder et al. | |
| 6,689,675 B1 | 2/2004 | Parker et al. | |
| 6,759,302 B1 * | 7/2004 | Chen et al. | 438/275 |
| 6,893,979 B2 | 5/2005 | Khare et al. | |
| 7,314,812 B2 * | 1/2008 | Wang | 438/510 |
| 2003/0080389 A1 | 5/2003 | Hu et al. | |

* cited by examiner

*Primary Examiner*—Tuan N. Quach
(74) *Attorney, Agent, or Firm*—Blakely, Sokoloff, Taylor & Zafman LLP

(57) ABSTRACT

A dielectric layer may be formed by depositing the dielectric layer to an intermediate thickness and applying a nitridation process to the dielectric layer of intermediate thickness. The dielectric layer may then be deposited to the final, desired thickness.

20 Claims, 5 Drawing Sheets

US 7,511,321 B2

METHOD FOR FORMING A DIELECTRIC LAYER AND RELATED DEVICES

RELATED APPLICATIONS

The present divisional application is related to, incorporates by reference and hereby claims the priority benefit of the following U.S. patent application, assigned to the assignee of the present application: U.S. patent application Ser. No. 10/435,239, filed May 8, 2003 now U.S. Pat. No. 7,101,811.

TECHNICAL FIELD

Embodiments of the invention generally relate to the field of semiconductor devices and, more particularly, to a method for forming a dielectric layer and related devices.

BACKGROUND

Semiconductor devices typically include a semiconductor substrate and one or more thin-films deposited onto the semiconductor substrate. The thin-films form layers that provide the basis for the electrical and optical characteristics of the semiconductor device. The process of forming these layers on the surfaces of a substrate is called thin-film deposition or simply deposition.

The term "dielectric layer" broadly refers to thin-films that are deposited to provide electrical insulation. An exemplary dielectric layer is a transistor gate dielectric film. A transistor gate dielectric film may be used, for example, to electrically insulate a gate electrode from an underlying substrate in a field effect transistor (FET). Nitrogen is typically incorporated into a dielectric layer to enhance the performance of the layer.

Nitridation refers to the process during which nitrogen is incorporated into a dielectric layer. Nitrogen incorporation, if properly performed, suppresses dopant diffusion, mitigates positive flatband voltage shifts, reduces leakage current, and improves reliability. Incorporated nitrogen, however, may not only fail to provide these benefits but also can significantly degrade carrier mobility, if the nitrogen is present in excess or placed at unsuitable locations in the dielectric layer.

In conventional dielectric layer formation, nitridation is applied either before or after the dielectric layer is deposited. The former process is called pre-deposition nitridation and the latter process is called post-deposition nitridation. In post-deposition nitridation, the dielectric layer is deposited to its final thickness and then nitrided, for example, by exposing the film to ammonia ($NH_3$) gas at elevated temperatures (e.g., 300-500° C.) or by exposing the film to a remote plasma for nitridation. The entire dielectric layer is exposed to the nitridation process because the dielectric layer has already been deposited to its final thickness.

Pre-deposition nitridation typically involves applying a thin-film that is rich in N (e.g., a thin nitride film) to an upper surface of a substrate prior to depositing the dielectric layer. The dielectric layer is then deposited over the thin nitride film. In contrast to post-deposition nitridation, the nitrogen species are concentrated between the substrate and the dielectric layer. Examples of nitride films that are commonly used in pre-deposition nitridation are silicon nitride ($Si_3N_4$) and silicon oxynitride ($SiO_xN_y$).

Thus, conventional dielectric layer processing provides two extreme nitridation choices. Nitrogen species are either distributed throughout a dielectric layer in a substantially uniform concentration (e.g., with post-deposition nitridation) or nitrogen species are concentrated at the interface between the dielectric layer and an underlying substrate (e.g., in pre-deposition nitridation).

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to a method for forming a dielectric layer and resulting devices and systems. In an embodiment of the invention, a dielectric layer is deposited to an intermediate thickness on a surface of a substrate made of a semiconductor material. A nitridation process is then applied to the dielectric layer of intermediate thickness to incorporate nitrogen into the dielectric layer. The dielectric layer is then deposited to its final thickness. As stated above, conventional nitridation processes are limited to post-nitridation and pre-nitridation. In post-nitridation processes, the nitrogen species are uniformly distributed throughout the dielectric layer. In pre-nitridation processes, the nitrogen species are concentrated at the interface between the dielectric layer and the substrate. In contrast, embodiments of the invention allow for nitrogen species to be concentrated practically anywhere within the dielectric layer.

Figure 1:
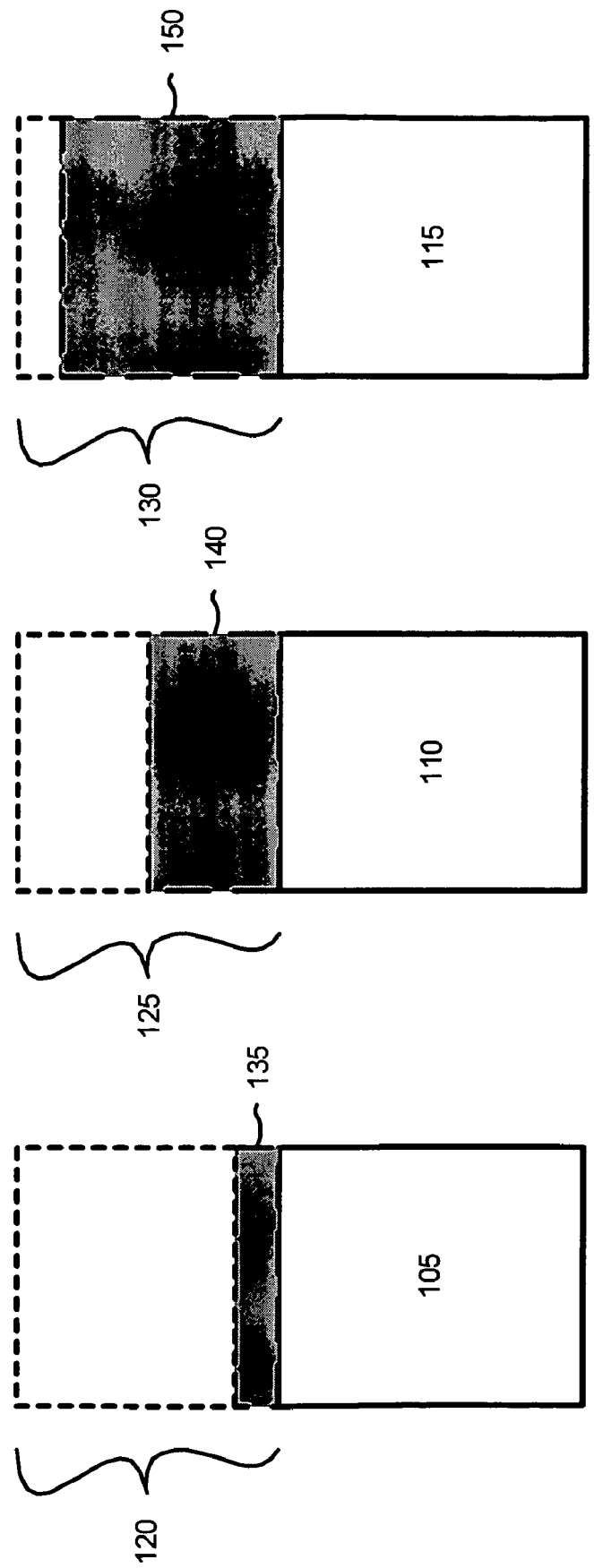
FIG. 1A is a conceptual illustration in which dielectric layer 120 is deposited to an intermediate thickness of approximately one to five percent of a final thickness.
FIG. 1B is a conceptual illustration in which dielectric layer 125 is deposited to an intermediate thickness of approximately 50 percent of a final thickness.
FIG. 1C is a conceptual illustration in which dielectric layer 130 is deposited to an intermediate thickness of approximately 95-99 percent of a final thickness.

FIGS. 1A-1C are conceptual illustrations of three exemplary dielectric layers formed according to an embodiment of the invention. Dielectric layers 120, 125, and 130 are respectively deposited on an upper surface of substrates 105, 110, and 115, according to an embodiment of the invention. Substrates 105, 110, and 115 may be composed of a broad range of semiconductor materials including: elemental semiconductor materials, compound semiconductor materials (e.g., III-V compounds and II-VI compounds), direct bandgap semiconductor materials, and indirect bandgap semiconductor materials. Examples of suitable elemental semiconductor materials include, for example, silicon (Si, Z=14) and germanium (Ge, Z=32).

FIG. 1A is a conceptual illustration in which dielectric layer 120 is deposited to an intermediate thickness 135. Intermediate thickness 135 is approximately one to five percent of the desired dielectric layer thickness, in the illustrated embodiment of the invention. A nitridation process is applied to dielectric layer of intermediate thickness 135 to incorporate nitrogen into the layer. The nitridation process may include thermal nitridation or chemical/physical nitridation. Nitridation processes are more fully described below with reference to FIG. 2.

Dielectric layer 120 is then deposited to a final, desired thickness. The shaded area of intermediate thickness 135 shows that the nitrogen species are concentrated at the interface with substrate 105, in the illustrated embodiment of the invention. The reason that the nitrogen species are concentrated at the interface is that the nitridation process was performed when the dielectric layer was deposited to an intermediate thickness of approximately one to five percent of its final thickness.

FIG. 1B is a conceptual illustration in which dielectric layer 125 is deposited to an intermediate thickness 140. Intermediate thickness 140 is approximately 50 percent of the desired dielectric layer thickness, in the illustrated embodiment of the invention. A nitridation process is applied to dielectric layer of intermediate thickness 140 to incorporate nitrogen into the region. Dielectric layer 125 is then deposited to a final, desired thickness. As illustrated by the shaded area, the nitrogen species are primarily distributed in the lower half of dielectric layer 125. Thus, FIG. 1B illustrates a nitridation concentration profile that is not possible using conventional pre-nitridation or post-nitridation processes.

FIG. 1C is a conceptual illustration in which dielectric layer 130 is deposited to an intermediate thickness 150. Intermediate thickness 150 is approximately 95-99 percent of the desired dielectric layer thickness, in the illustrated embodiment of the invention. A nitridation process is applied to dielectric layer of intermediate thickness 150 to incorporate nitrogen into the region. Dielectric layer 130 is then deposited to a final, desired thickness. As illustrated by the shaded area, the nitrogen species are distributed throughout the entirety of dielectric layer 130 because intermediate thickness 150 is very close to the final (e.g., desired) thickness of dielectric layer 130.

Figure 2:
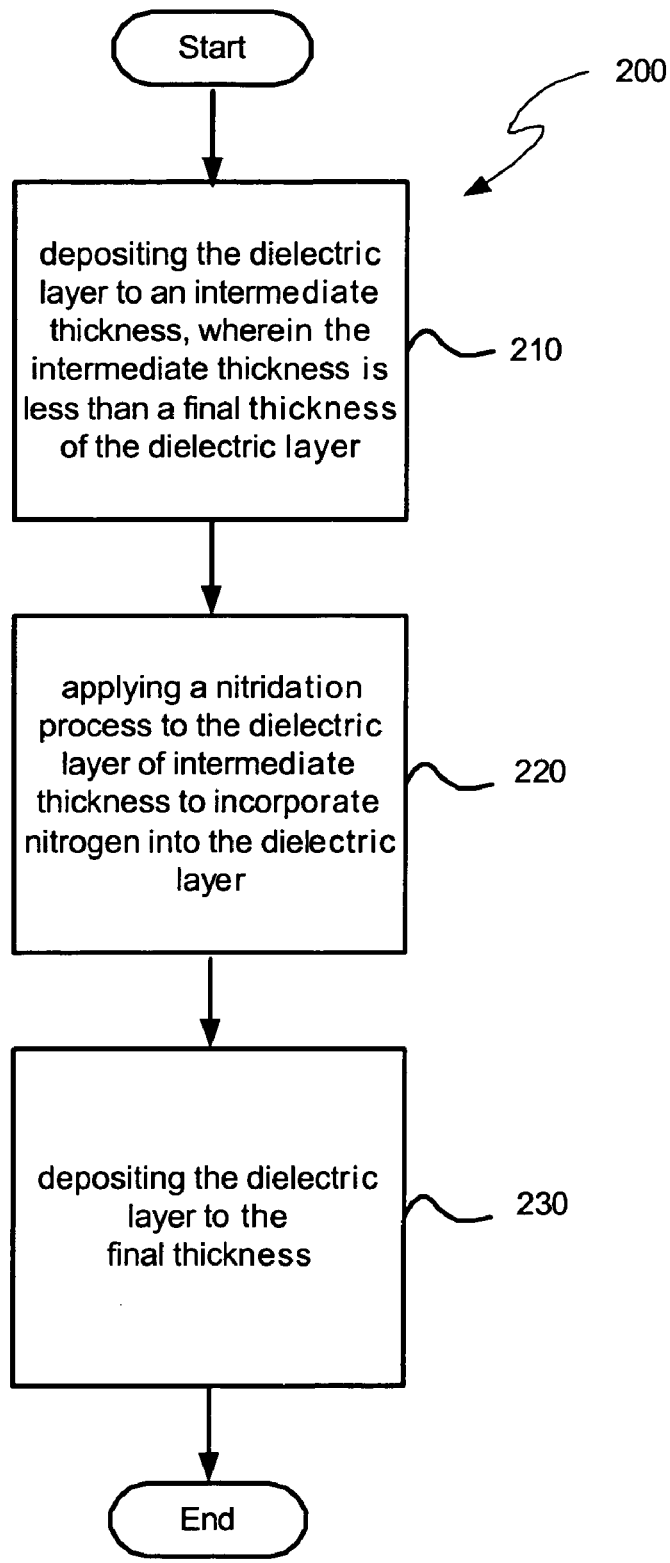
FIG. 2 is a flow diagram illustrating certain aspects of a method for incorporating nitrogen with a particular desired concentration into thin-films, according to an embodiment of the invention.

FIG. 2 is a flow diagram illustrating certain aspects of a method for incorporating nitrogen with a particular desired concentration into thin-films, according to an embodiment of the invention. Referring to process block 210, in an embodiment, a dielectric layer is deposited to an intermediate thickness. The term dielectric layer broadly refers to thin-film structures of dielectric material deposited on a semiconductor substrate to form electrical and optical devices. The dielectric layer may be composed of, for example, $Al_2O_3$, $SiO_2$, $HfO_2$, $ZrO_2$, $TiO_2$, $La_2O_3$, $Y_2O_3$, $Gd_2O_3$, $GeO_2$, $SrTiO_3$, metal silicates (e.g., $Hf_xSi_yO_z$) and/or metal aluminates (e.g., $Hf_xAl_yO_z$).

A wide variety of deposition techniques may be employed to deposit the dielectric layer, in an embodiment of the invention, including chemical vapor deposition and physical vapor deposition. Examples of suitable chemical vapor deposition (CVD) processes, include, but are not limited to: atomic layer deposition, CVD epitaxy, atmospheric-pressure CVD (APCVD), low-pressure CVD (LPCVD), metalorganic CVD (MOCVD), photo-enhanced CVD (PHCVD), laser-induced CVD (PCVD), electron enhanced CVD, and plasma-enhanced CVD.

Atomic layer deposition (ALD) refers to the controlled deposition of single atomic layers on a substrate. ALD is also known as atomic layer epitaxy (ALE) and atomic layer chemical vapor deposition (ALCVD). CVD processes are well known to persons of ordinary skill in the art and will not be further described except as to how they relate to embodiments of the invention.

Physical vapor deposition broadly encompasses both evaporation processes and sputtering processes. Evaporation processes typically include the following sequence of events: generating a vapor by boiling or subliming a source material, transporting the vapor from the source to a substrate, and condensing the vapor to form a film on the substrate surface. Examples of evaporation processes are conventional vacuum evaporation, electron-beam evaporation, molecular-beam epitaxy (MBE), and reactive evaporation. Dielectric layer deposition using evaporation processes are well known to those of ordinary skill in the art and will not be further described except as to as how they relate to embodiments of the invention.

Sputtering processes involve the ejection of surface atoms from an electrode surface by momentum transfer from bombarding ions to surface atoms. Examples of sputtering processes are diode sputtering, reactive sputtering, bias sputtering (ion plating), magnetron sputtering, ion beam deposition, ion beam sputter deposition, reactive ion plating, and cluster beam deposition (CBD). Sputter deposition processes are well known to those of ordinary skill in the art and will not be further described except as to how they relate to embodiments of the invention.

Physical vapor deposition also includes pulsed laser deposition and epitaxial growth. Epitaxial growth refers to growing an oriented single-crystal layer on a substrate. Pulsed laser deposition (PLD) refers to using pulses of laser light to generate an atomic "spray" that is deposited on a substrate. Epitaxial growth and PLD are well known to those of ordinary skill in the art and will not be further described except as to how they relate to embodiments of the invention.

The term intermediate thickness broadly refers to any thickness that is less than the desired (or final thickness) of the dielectric layer. Dielectric layers are typically formed on semiconductor substrates to create electrical and optical devices. These dielectric layers typically have a predetermined (e.g., desired) thickness. Depositing a dielectric layer to an intermediate thickness refers to depositing the dielectric layer to a fraction of the desired thickness (e.g., 1%, 5%, 12.5%, 25%, 50%, 95%, etc.).

Referring to process block 220, a nitridation process is applied to the dielectric layer of intermediate thickness. The term nitridation process broadly refers to processes that incorporate nitrogen into a dielectric layer. Nitridation processes that may be used in embodiments of the invention include thermal nitridation and chemical/physical nitridation.

Thermal nitridation refers to exposing a dielectric layer (of intermediate or final thickness) to a gas containing nitrogen at elevated temperatures. Examples of gasses that are suitable for thermal nitridation include $N_2O$, $NO$, $NH_3$, and $N_2$. The temperatures suitable for thermal nitridation typically range between 300° C. to 500° C. but temperatures outside of that range are used in some cases. Thermal nitridation is well known to those of ordinary skill in the art and will not be further described except as to how it relates to embodiments of the invention.

Chemical/physical nitridation processes include chemical vapor deposition (CVD), rapid thermal CVD (RTCVD), plasma nitridation, remote plasma nitridation (RPN), ion implantation, and atomic layer deposition (ALD). Plasma nitridation refers to generating nitrogen species in a plasma for incorporation into a dielectric layer. Remote plasma nitridation (RPN) refers to plasma nitridation processes in which the dielectric layer is not directly exposed to the plasma.

Chemical/physical nitridation processes (e.g., RPN) are well known to those of ordinary skill in the art and will not be further described except as to how they relate to embodiments of the invention.

Inserting the nitridation process before film deposition is complete enables greater manipulation and control of nitrogen concentration profiles in thin-films than conventional nitridation processes provide. As stated above, conventional nitridation processes are generally limited to either pre-deposition nitridation or post-deposition nitridation. In pre-deposition nitridation, the nitrogen species are concentrated at the interface between the substrate and the dielectric layer. In post-deposition nitridation, the nitrogen species are distributed throughout the entire dielectric layer. Thus, conventional nitridation merely provides for one of two extremes.

In alternative embodiments of the invention, an oxidation process is performed at process block 220, instead of, or in addition to, the above described nitridation process. The oxidation process may include thermal oxidation and/or chemical/physical oxidation. The source of oxygen for the oxidation process may be $H_2O$, $O_2$, $O_3$, etc. Oxidation processes are well known to those of ordinary skill in the art and will not be further described except as to how they relate to embodiments of the invention.

Referring to process block 230, in an embodiment of the invention, the dielectric layer is deposited to a final thickness. The deposition techniques suitable for process block 230 include, for example, any of the deposition techniques discussed above with reference to process block 210. In an embodiment of the invention, the same deposition technique is used in process blocks 210 and 230. In an alternative embodiment of the invention, different deposition techniques are used in process blocks 210 and 230. For example, in an embodiment of the invention, plasma-enhanced CVD is used in process block 210 and atomic layer deposition is used in process block 230.

The term final thickness broadly refers to depositing the dielectric layer to a final, desired thickness for the dielectric layer. Dielectric layers are typically deposited precisely to a desired thickness. The desired thickness is usually dictated by electrical and/or optical properties of a larger device of which the dielectric layer is a part. The term final thickness refers to depositing the dielectric layer to the desired thickness that is typically dictated by the electrical and/or optical properties of the larger device.

Figure 3:
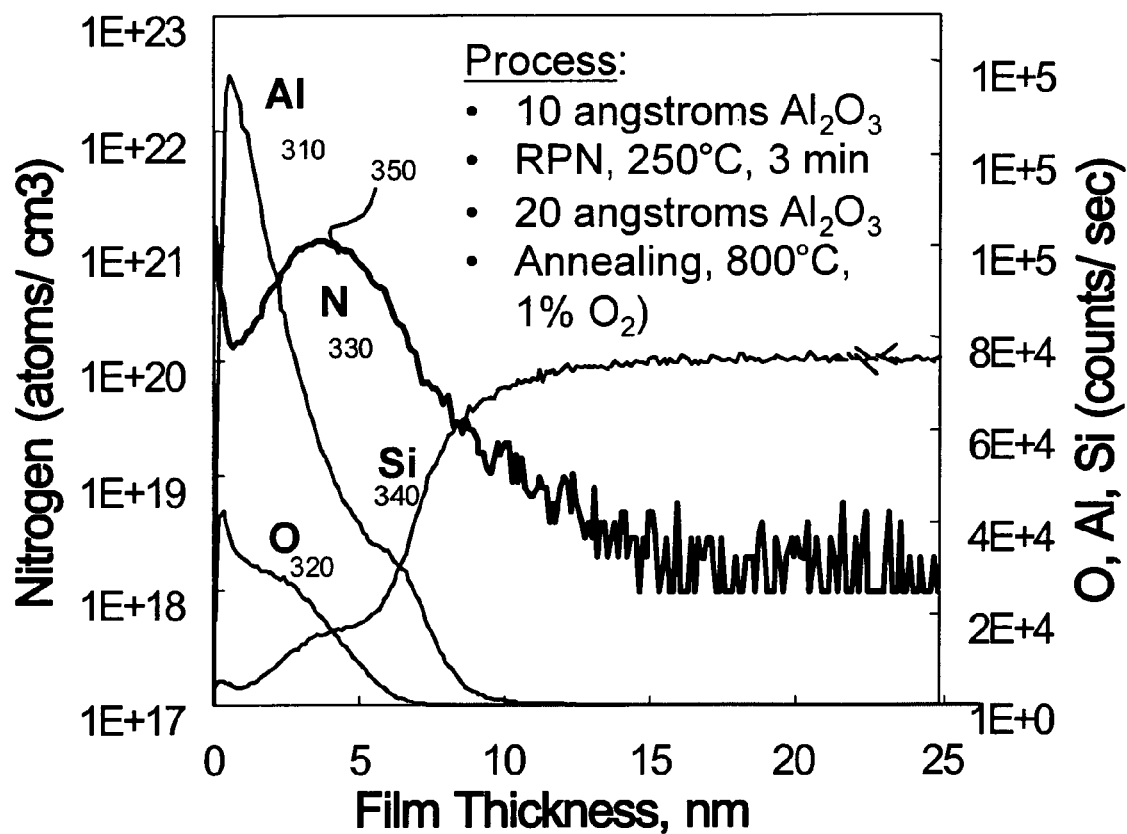
FIG. 3 illustrates concentration profiles of an exemplary dielectric layer deposited, according to an embodiment of the invention.

FIG. 3 illustrates concentration profiles of an exemplary dielectric layer deposited, according to an embodiment of the invention. The exemplary concentration profiles were obtained using Secondary Ion Mass Spectroscopy (SIMS). In the embodiment illustrated in FIG. 3, the dielectric layer is composed of $Al_2O_3$. Concentration levels 310, 320, 330, and 340 show the concentration levels of aluminum (Al), oxygen (O), nitrogen (N), and silicon (Si), respectively. The dielectric layer was deposited to an intermediate thickness using atomic layer deposition (ALD), according to an embodiment of the invention. Remote plasma nitridation (RPN) was used to incorporate nitrogen into the dielectric layer of intermediate thickness. ALD was then used to deposit the dielectric layer to the final, desired thickness. Reference numeral 350 shows that nitrogen was concentrated near the interface between the substrate and the dielectric layer, in the illustrated embodiment of the invention.

Figure 4:
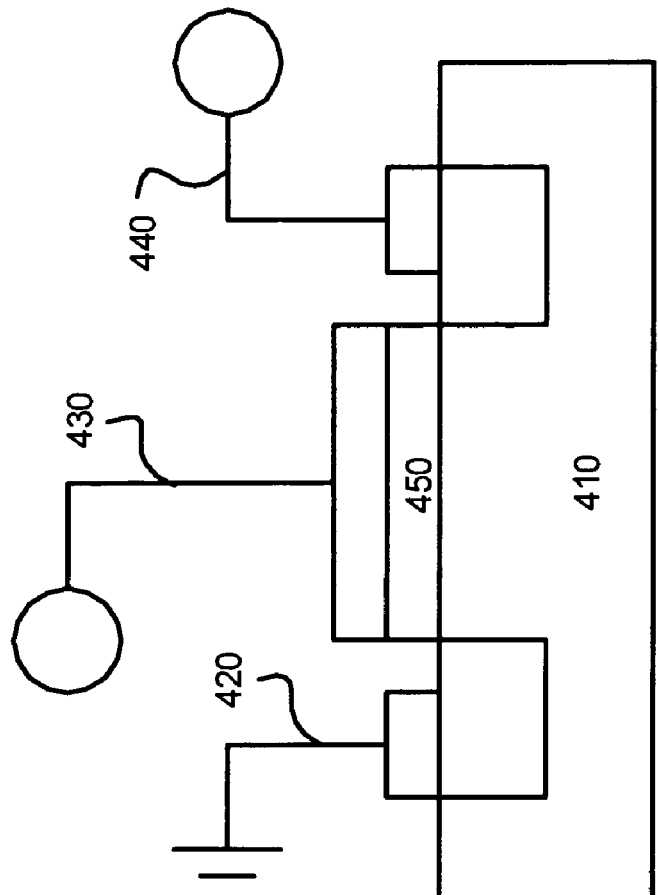
FIG. 4 is a block diagram of metal-oxide semiconductor field-effect transistor (MOSFET) 400, implemented according to an embodiment of the invention.

FIG. 4 is a block diagram of metal-oxide semiconductor field-effect transistor (MOSFET) 400, implemented according to an embodiment of the invention. MOSFET 400 includes substrate 410, source 420, gate 430, and drain 440.

As is well known in the art, gate 430 provides an electric field that allows current to flow between the source and the drain.

Dielectric layer 450, provides electrical insulation between gate 430 and substrate 410. Dielectric layer 450 is formed according to the process disclosed with reference to FIG. 2, in an embodiment of the invention, and is composed of, for example $Al_2O_3$. Dielectric layer 450 is first deposited to an intermediate thickness of, for example 10 angstroms. A nitridation process, for example RPN, is then applied to dielectric layer 450. Dielectric layer 450 is then deposited to its final thickness (e.g., 30 angstroms). An annealing step (e.g., at 800° C. and 1% $O_2$) may be performed after dielectric layer 450 has been deposited to its final thickness.

The term leakage current refers to current that flows through dielectric layer 450. In the embodiment of the invention illustrated in FIG. 4, leakage current is significantly reduced in comparison to a conventional dielectric layer because process 200 enables dielectric layer 450 to have a nitrogen concentration profile that is not possible with conventional dielectric layers. While leakage current is discussed with respect to dielectric layer 450 in MOSFET 400, a person of ordinary skill in the art will appreciate that leakage current is a concern in a wide range circumstances.

Figure 5:
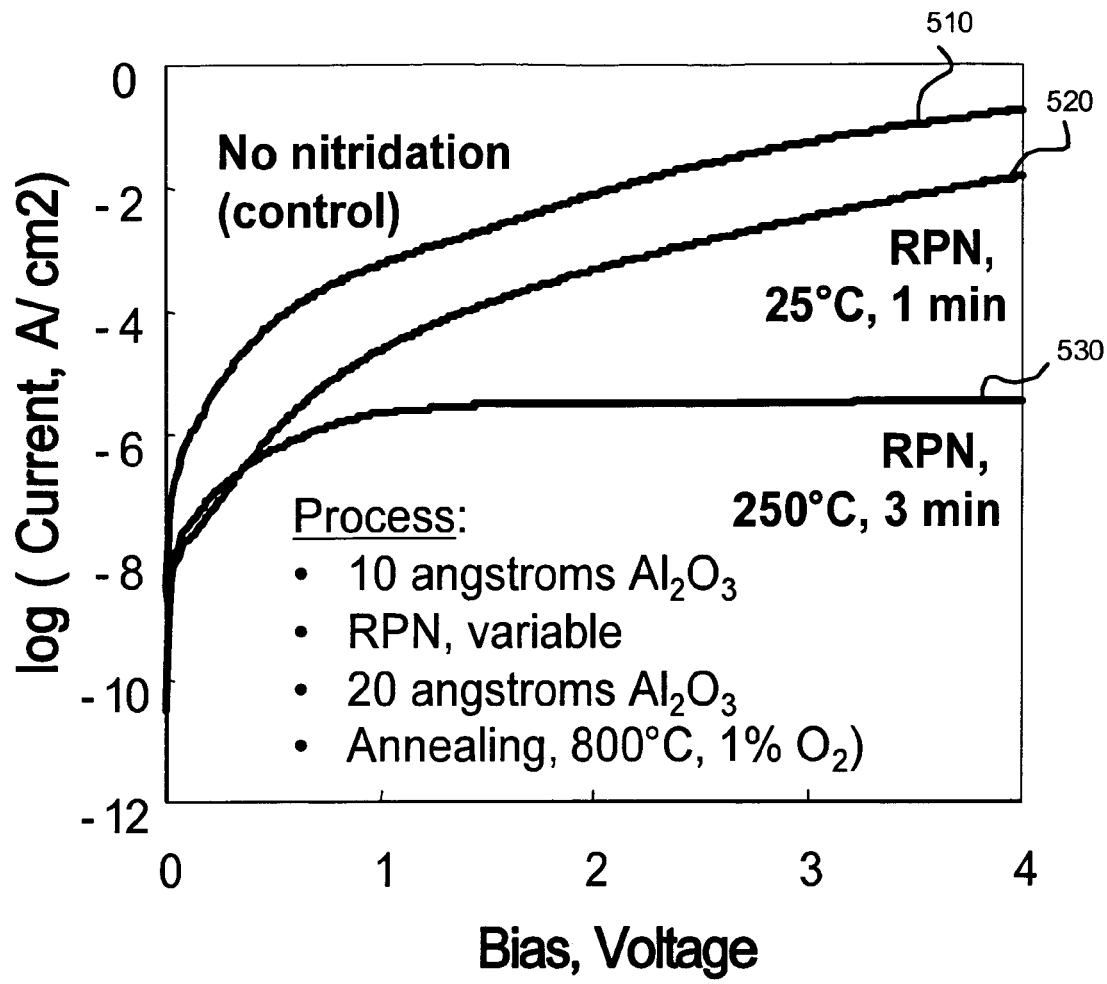
FIG. 5 illustrates the effects of nitridation on leakage current in dielectric layer 450, according to an embodiment of the invention.

FIG. 5 illustrates the effects of nitridation on leakage current in dielectric layer 450, according to an embodiment of the invention. The plot presented in FIG. 5 shows the relationship between bias voltage and leakage current for curves 510, 520, and 530. Curve 510 illustrates leakage current for the case in which no nitridation step is performed during the deposition process. In contrast, curve 520 and 530 illustrate the effect of different nitridation processes, according to an embodiment of the invention. In curve 520, the nitridation process consisted of RPN at 25° C. for one minute. Curve 530 shows leakage current for the case in which the nitridation process consisted of RPN at 250° C. for three minutes. As shown by FIG. 5, leakage current can be reduced by several orders of magnitude, according to an embodiment of the invention.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A device comprising:
a substrate made of a semiconductor material;
a dielectric layer, having a final thickness, formed on an upper surface of the substrate, wherein the dielectric layer comprises an initial dielectric layer of intermediate thickness, which is less than the final thickness; and a final dielectric layer, wherein the initial dielectric layer comprises nitrogen distributed non-uniformly throughout the initial dielectric layer, wherein the concentration profile of nitrogen within the dielectric layer having a final thickness comprises a bell-shaped curve with a substantial higher peak concentration of nitrogen within a central core of the initial dielectric layer, wherein the concentration of nitrogen at an interface between the initial dielectric layer and the final dielectric layer is substantially reduced, and the concentration of nitrogen at an interface between the initial dielectric layer and the substrate is also substantially reduced; and
an electrical lead in communication with the dielectric layer to provide an electrical field to the substrate through the dielectric field.

2. The device of claim 1, wherein the dielectric layer of final thickness is formed according to the method of forming a dielectric layer on a semiconductor substrate comprising: depositing the initial dielectric layer to an intermediate thickness, wherein the intermediate thickness is less than a final thickness of the dielectric layer; applying a nitridation process to the initial dielectric layer of intermediate thickness to enhance incorporation of nitrogen into the initial dielectric layer; and then depositing a final dielectric layer to form the final thickness of the dielectric layer, wherein the deposition of the final dielectric layer occurs predominantly at the top surface of the nitrided initial dielectric layer.

3. The device of claim 2, wherein incorporating nitrogen into the initial dielectric layer of intermediate thickness comprises exposing the initial dielectric layer of intermediate thickness to thermal nitridation in a gas selected from the group consisting of $N_2O$ gas, NO gas, $NH_3$ gas, $N_2$ gas, and any combination thereof.

4. The device of claim 2, wherein incorporating nitrogen into the dielectric layer of intermediate thickness comprises exposing the dielectric layer of intermediate thickness to a plasma nitridation process selected from the group consisting of $N_2O$ plasma nitridation, NO plasma nitridation, $NH_3$ plasma nitridation, $N_2$ plasma nitridation, and any combination thereof.

5. The device of claim 2, wherein the final dielectric is deposited by a method selected from the group consisting of chemical vapor deposition (CVD) and physical vapor deposition (PVD).

6. The device of claim 2, further comprising applying an oxidation process to the dielectric layer of intermediate thickness to incorporate oxygen into the dielectric layer.

7. The device of claim 6, wherein applying the oxidation process to the dielectric layer of intermediate thickness comprises exposing the dielectric layer of intermediate thickness to thermal nitridation in $O_2$ gas.

8. The device of claim 6, wherein applying the oxidation process to the dielectric layer of intermediate thickness comprises exposing the dielectric layer of intermediate thickness to $O_2$ plasma nitridation.

9. The device of claim 6, wherein applying the oxidation process to the dielectric layer of intermediate thickness comprises exposing the dielectric layer of intermediate thickness to thermal nitridation in $O_3$ gas.

10. The device of claim 6, wherein applying the oxidation process to the dielectric layer of intermediate thickness comprises exposing the dielectric layer of intermediate thickness to $O_3$ plasma nitridation.

11. The device of claim 2, wherein incorporating nitrogen into the initial dielectric layer comprises applying a remote plasma nitridation to the initial dielectric layer.

12. The device of claim 2, further comprising annealing the dielectric layer, wherein the anneal is performed at approximately 800° C. and in an environment comprising approximately 1% $O_2$.

13. The device of claim 1, wherein the dielectric layer comprises a dielectric layer substantially made of $Al_2O_3$.

14. The device of claim 1, wherein the device comprises a field effect transistor (FET), wherein the field effect transistor comprises a gate dielectric comprising the dielectric layer having a final thickness.

15. The device of claim 14, wherein the gate dielectric comprising the dielectric layer formed by the method of forming the dielectric layer further comprising incorporating oxygen into the initial dielectric layer while also incorporating said nitrogen into the initial dielectric layer.

16. The device of claim 1, wherein the dielectric layer comprises a material selected from the group consisting of $HfO_2$, $ZrO_2$, $TiO_2$, $La_2O_3$, $Y_2O_3$, $Gd_2O_3$, $GeO_2$, $SrTiO_3$, metal silicates, metal aluminates, and any combination thereof.

17. The device of claim 1, wherein the device comprises a metal oxide semiconductor field-effect transistor (MOSFET), wherein the metal oxide semiconductor field effect transistor comprises a gate dielectric comprising the dielectric layer having a final thickness.

18. The device of claim 17, wherein the substrate comprises germanium.

19. The device of claim 1, wherein the dielectric layer comprises a dielectric layer made of $SiO_2$.

20. The device of claim 1,
wherein the concentration profile of nitrogen within the dielectric layer having a final thickness comprises a bell-shaped curve when plotted on a logarithmic scale, with a substantially higher peak concentration of nitrogen within the central core of the initial dielectric layer of at least a plurality of times that of the concentration of nitrogen at the interface between the semiconductor material and the initial dielectric layer and/or the interface between the initial dielectric layer and the final dielectric layer, so that the distributed nitrogen concentration is non-uniformly distributed, having a substantial peak in the central core of the dielectric and substantially lowered concentration of nitrogen at said interfaces, and thus providing increased suppression of dopant diffusion, a reduction in leakage current, improved reliability, mitigated positive flatband voltage shifts, and/or reduced degradation of carrier mobility.

* * * * *